(12) United States Patent
Bhushan et al.

(10) Patent No.: US 10,475,985 B2
(45) Date of Patent: Nov. 12, 2019

(54) MRAM MAGNETIC SHIELDING WITH FAN-OUT WAFER LEVEL PACKAGING

(71) Applicant: GLOBALFOUNDRIES Singapore Pte. Ltd., Singapore (SG)

(72) Inventors: Bharat Bhushan, Singapore (SG); Juan Boon Tan, Singapore (SG); Wanbing Yi, Singapore (SG); Pak-Chum Danny Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 78 days.

(21) Appl. No.: 15/241,100

(22) Filed: Aug. 19, 2016

(65) Prior Publication Data

US 2016/0359100 A1    Dec. 8, 2016

Related U.S. Application Data

(63) Continuation-in-part of application No. 15/080,562, filed on Mar. 24, 2016, and a continuation-in-part of
(Continued)

(51) Int. Cl.
*H01L 43/12* (2006.01)
*H01L 43/02* (2006.01)
(Continued)

(52) U.S. Cl.
CPC ............ *H01L 43/02* (2013.01); *H01L 23/295* (2013.01); *H01L 23/552* (2013.01); *H01L 24/19* (2013.01);
(Continued)

(58) Field of Classification Search
CPC ....... H01L 23/552; H01L 43/02; H01L 43/08; H01L 43/10; H01L 43/12
See application file for complete search history.

(56) References Cited

U.S. PATENT DOCUMENTS 7,545,662 B2   6/2009   Wang et al.
7,772,679 B2   8/2010   Chang et al.
(Continued)

*Primary Examiner* — Sue A Purvis
*Assistant Examiner* — Scott Stowe
(74) *Attorney, Agent, or Firm* — Thompson Hine LLP

(57) ABSTRACT

Magnetic random access memory (MRAM) fan-out wafer level packages with package level and chip level magnetic shielding and methods of forming these magnetic shields processed at the wafer-level are disclosed. The method includes providing a MRAM wafer prepared with a plurality of MRAM dies. The MRAM wafer is processed to form a magnetic shield layer over the front side of the MRAM wafer, and the wafer is separated into a plurality of individual dies. An individual MRAM die includes front, back and lateral surfaces and the magnetic shield layer is disposed over the front surface of the MRAM die. Magnetic shield structures are provided over the individual MRAM dies. The magnetic shield structure encapsulates and surrounds back and lateral surfaces of the MRAM die. An encapsulation layer is formed to cover the individual MRAM dies which are provided with magnetic shield structures. A redistribution layer (RDL) is formed over and lines exposed front surfaces of the encapsulated MRAM dies and the encapsulated MRAM dies are separated into individual MRAM fan-out wafer level packages.

16 Claims, 9 Drawing Sheets

Related U.S. Application Data application No. 15/080,541, filed on Mar. 24, 2016, now Pat. No. 9,875,971.

(60) Provisional application No. 61/195,807, filed on Jul. 23, 2015, provisional application No. 62/138,413, filed on Mar. 26, 2015.

(51) Int. Cl.
    *H01L 23/552*      (2006.01)
    *H01L 23/29*      (2006.01)
    *H01L 23/00*      (2006.01)
    *H01L 21/56*      (2006.01)

(52) U.S. Cl.
CPC .............. *H01L 24/20* (2013.01); *H01L 24/96* (2013.01); *H01L 24/97* (2013.01); *H01L 43/12* (2013.01); *H01L 21/561* (2013.01); *H01L 21/568* (2013.01); *H01L 24/32* (2013.01); *H01L 24/73* (2013.01); *H01L 24/83* (2013.01); *H01L 24/92* (2013.01); *H01L 2224/04105* (2013.01); *H01L 2224/12105* (2013.01); *H01L 2224/32245* (2013.01); *H01L 2224/73267* (2013.01); *H01L 2224/83005* (2013.01); *H01L 2224/83191* (2013.01); *H01L 2224/92244* (2013.01); *H01L 2924/1434* (2013.01); *H01L 2924/1435* (2013.01); *H01L 2924/15153* (2013.01); *H01L 2924/3025* (2013.01)

(56) References Cited

U.S. PATENT DOCUMENTS

| | | | |
|---|---|---|---|
| 8,796,046 | B2 | 8/2014 | Chen et al. |
| 9,252,108 | B2 | 2/2016 | Fujimori |
| 2006/0289970 | A1* | 12/2006 | Gogl ....................... G11C 11/15 |
| | | | 257/659 |
| 2010/0254182 | A1 | 10/2010 | Kuroiwa et al. |
| 2011/0198715 | A1 | 8/2011 | Matsuoka et al. |
| 2011/0241140 | A1 | 10/2011 | Tsujiuchi et al. |
| 2012/0193737 | A1 | 8/2012 | Pang et al. |
| 2013/0249024 | A1 | 9/2013 | Saida et al. |
| 2014/0001585 | A1 | 1/2014 | Dimitrov et al. |
| 2014/0264679 | A1 | 9/2014 | Lee et al. |
| 2015/0091109 | A1* | 4/2015 | Allinger ................ H01L 23/552 |
| | | | 257/421 |
| 2015/0243607 | A1* | 8/2015 | Jang ........................ H01L 24/73 |
| | | | 438/113 |
| 2015/0333018 | A1 | 11/2015 | Kim et al. |
| 2016/0093796 | A1* | 3/2016 | Arai ......................... H01L 43/02 |
| | | | 257/422 |
| 2016/0172580 | A1 | 6/2016 | Matsubara et al. |

\* cited by examiner

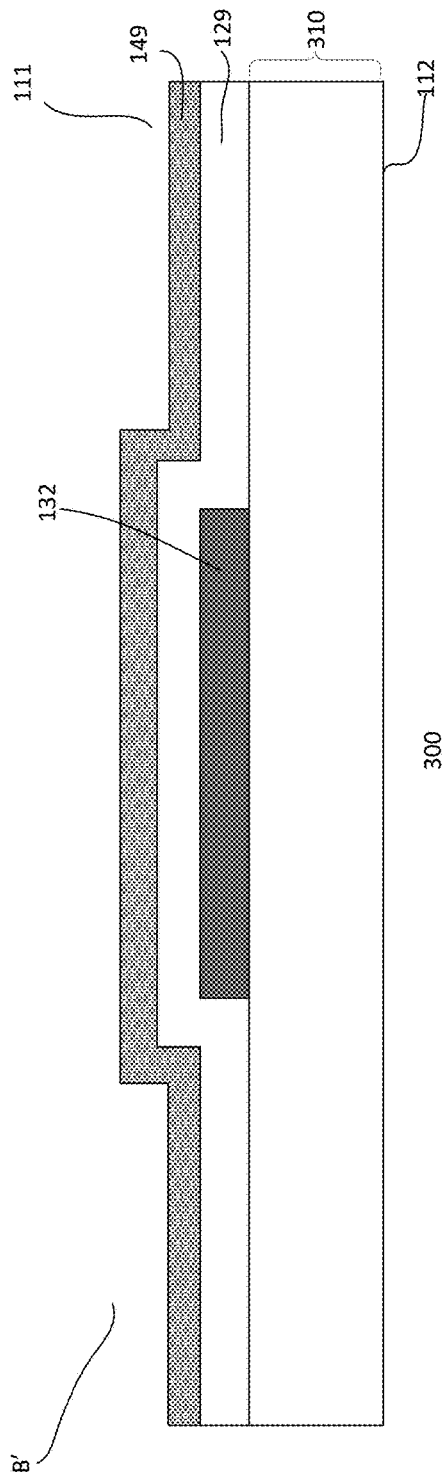
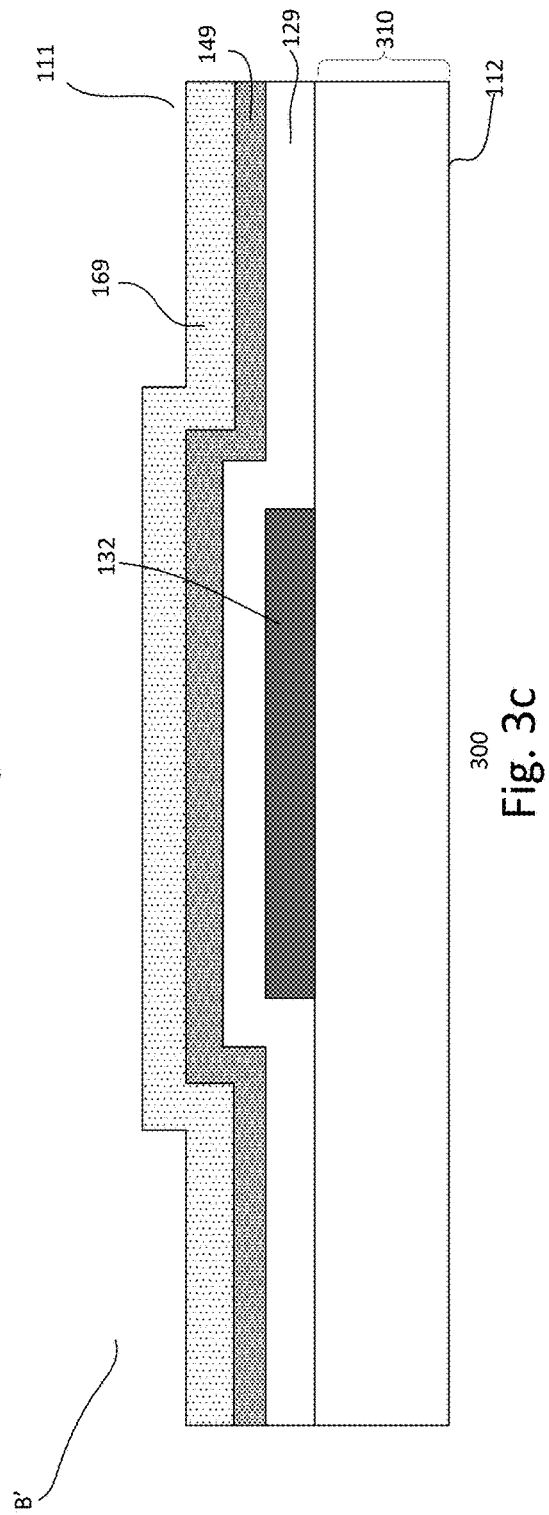

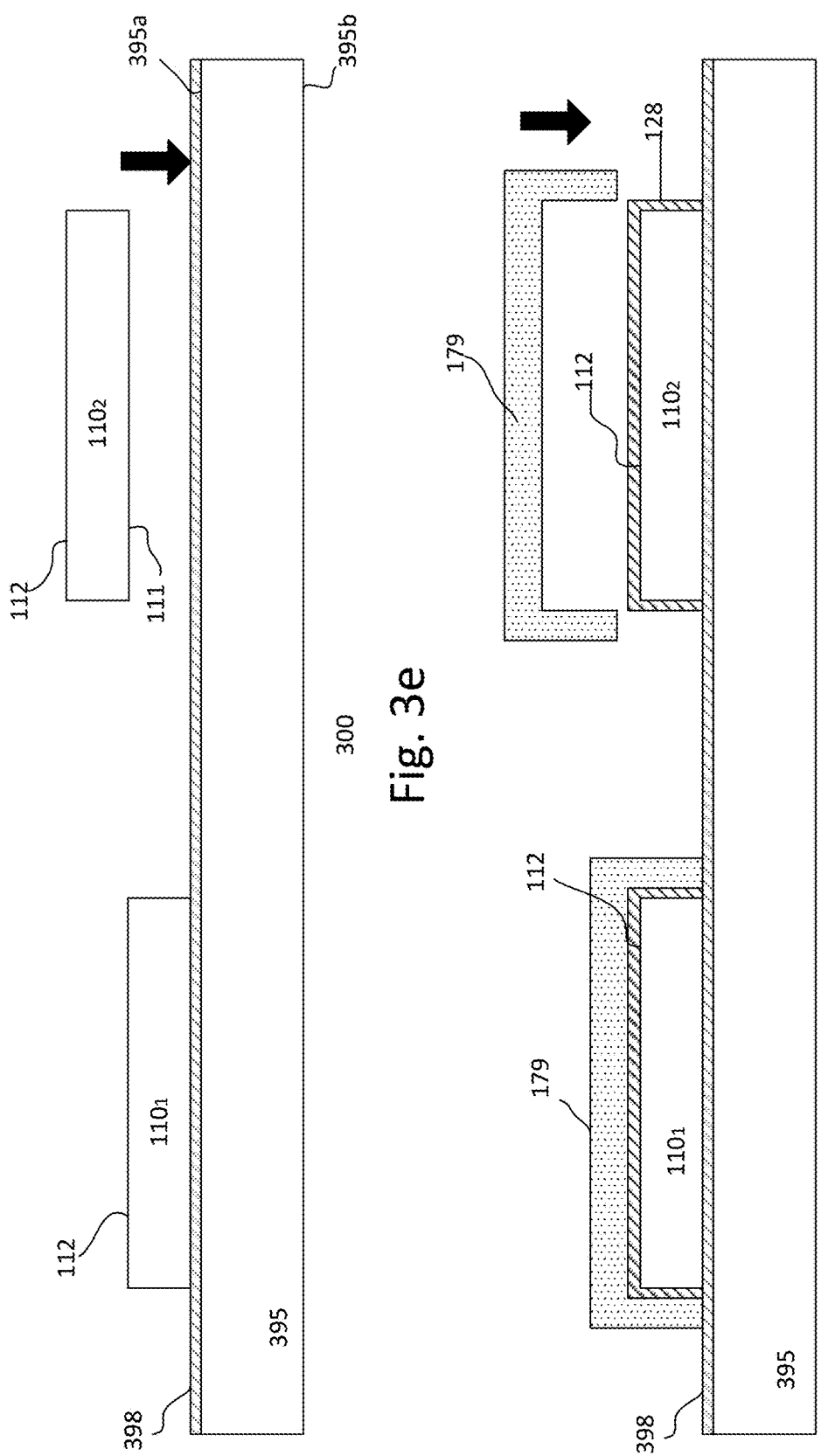

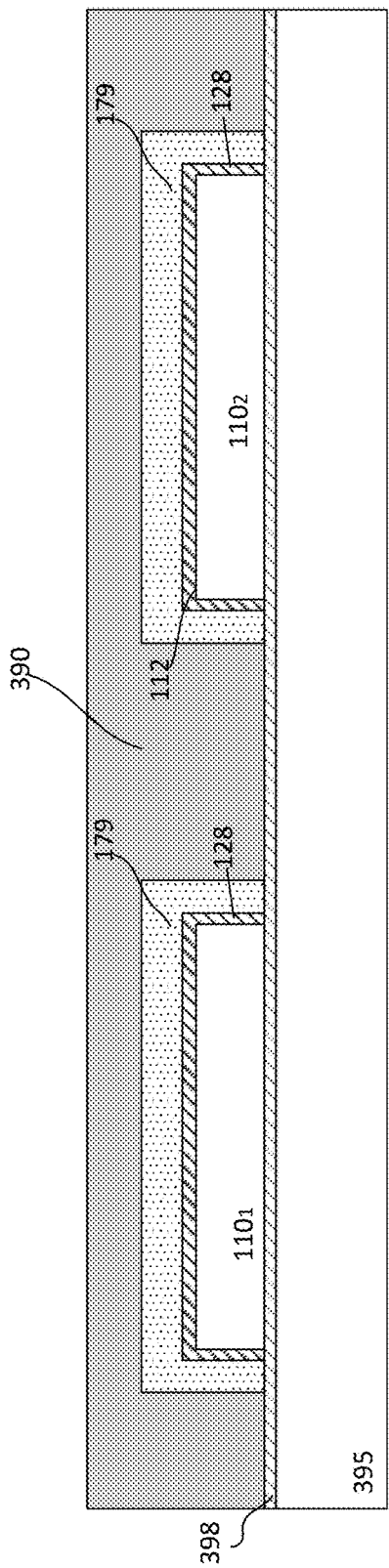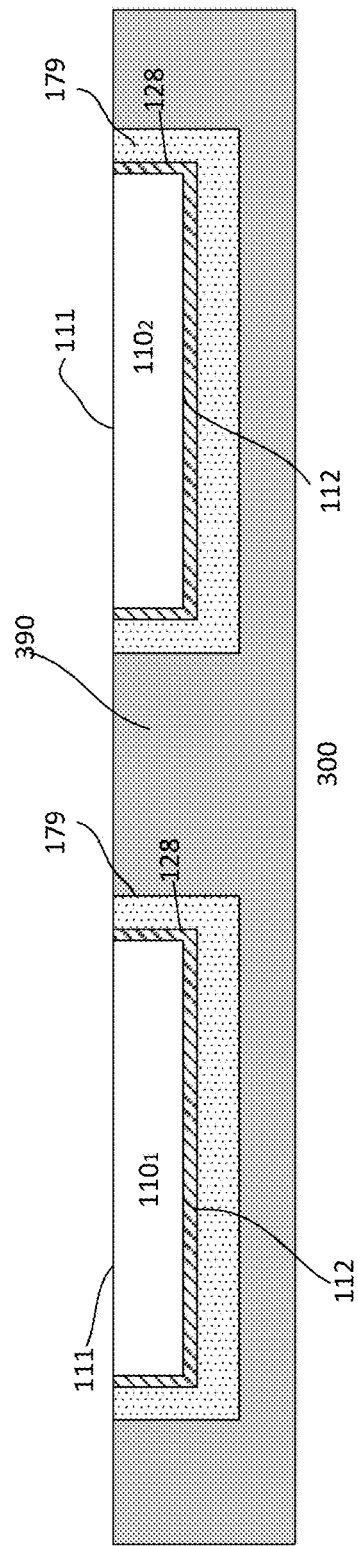

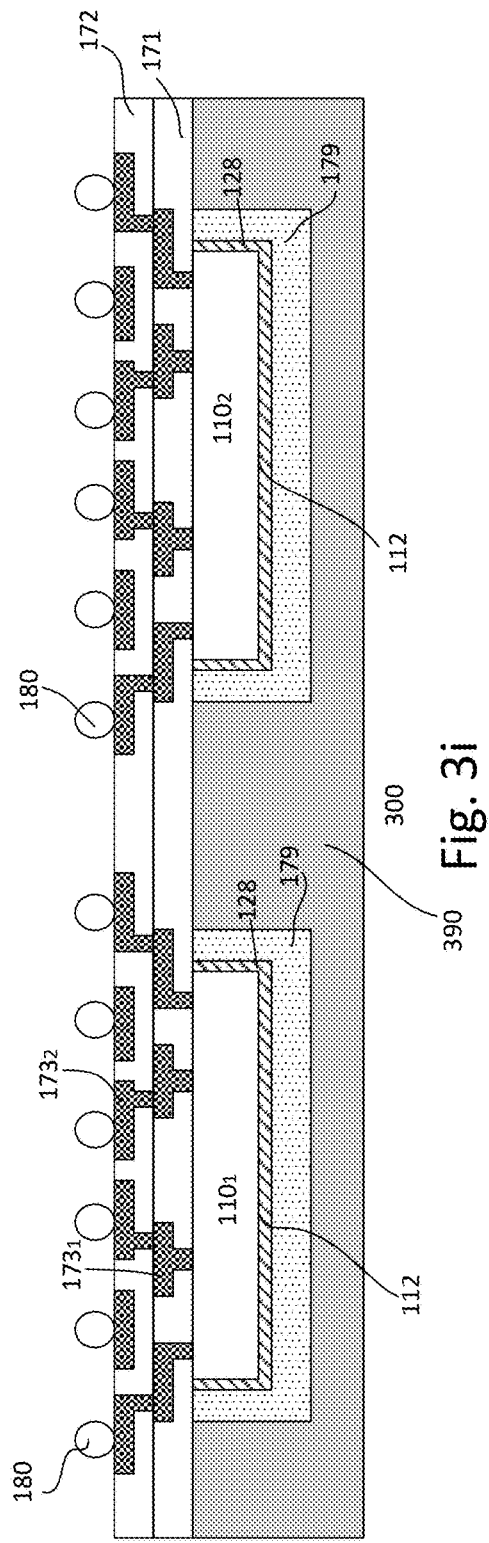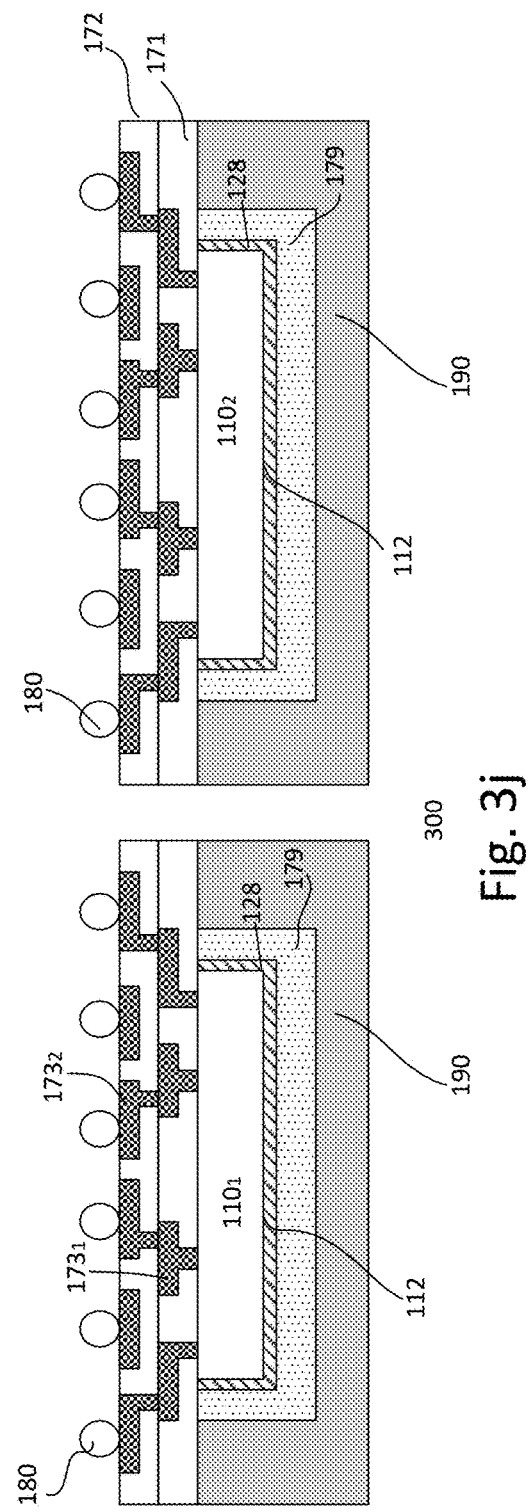

US 10,475,985 B2

MRAM MAGNETIC SHIELDING WITH FAN-OUT WAFER LEVEL PACKAGING

CROSS-REFERENCE TO RELATED APPLICATIONS

This application is a continuation-in-part application of co-pending U.S. patent application Ser. No. 15/080,541, filed on Mar. 24, 2016 which claims the priority benefit of 62/138,413 filed on Mar. 26, 2015, and this application is also a continuation-in-part application of U.S. patent application Ser. No. 15/080,562, filed on Mar. 24, 2016 which claims the priority benefit of 62/195,807, filed on Jul. 23, 2015, the disclosures of which are hereby incorporated by reference in their entireties for all purposes.

BACKGROUND

Magnetic random access memory (MRAM) is a nonvolatile random access memory which gains popularity in recent years as potential replacement for dynamic random access memory (DRAM), static random access memory (SRAM) and flash. MRAM, for example, includes magnetic tunnel junction (MTJ) element which uses magnetic polarization to store information. For example, READ and WRITE operations of the MRAM device rely on the MTJ element. However, magnetic interferences can be a problem for MRAM devices. For instance, MTJ functions can be affected by an external magnetic field. The external magnetic field may come from sources of magnetic flux such as power lines, bar magnets, or the earth. The external magnetic fields not only distort magnetic signals within the MTJ memory, but also induce changes on electrical signals of the circuits. READ and WRITE operations in MRAM devices are inevitably affected by external magnetic fields. These cause reliability issues in MRAM devices. Furthermore, as technology advances, MRAM chip area would not be enough to accommodate required number of interconnects at suitable distance. Thus, there is a need to allow fan-out and more space for interconnect routing.

Accordingly, it is desirable to provide reliable and cost effective techniques which provide magnetic shielding and fan-out solution for MRAM packages.

SUMMARY

Embodiments generally relate to magnetic random access memory (MRAM) fan-out wafer level packages with package level and chip level magnetic shields and methods of forming these magnetic shields at the wafer-level. In one embodiment, a method for forming a MRAM package is presented. The method includes providing a MRAM wafer prepared with a plurality of MRAM dies. The MRAM wafer is processed to form a magnetic shield layer over the front side of the MRAM wafer, and the wafer is separated into a plurality of individual dies. An individual MRAM die includes front, back and lateral surfaces and the magnetic shield layer is disposed over the front surface of the MRAM die. Magnetic shield structures are provided over the individual MRAM dies. The magnetic shield structure encapsulates and surrounds back and lateral surfaces of the MRAM die. An encapsulation layer is formed to cover the individual MRAM dies which are provided with magnetic shield structures. A redistribution layer (RDL) is formed over and lines the exposed front surfaces of the encapsulated MRAM dies and the encapsulated MRAM dies are separated into individual MRAM fan-out wafer level packages.

In yet another embodiment, a method of forming a magnetic random access memory (MRAM) package is disclosed. The method includes providing a MRAM die having front, back and lateral surfaces. The front surface defines an active or front side while the back surface defines an inactive or back side of the MRAM die. A magnetic shield layer is formed on the front side of the MRAM die. A magnetic shield structure which encapsulates and surrounds the back side and lateral surfaces of the MRAM die is provided. A redistribution layer (RDL) is formed over and lines the front side of the MRAM die. An encapsulation layer is formed to cover the MRAM die which is provided with the magnetic shield structure.

In yet another embodiment, a magnetic random access memory (MRAM) package is presented. The MRAM package includes a MRAM die having front, back and lateral surfaces. The front surface defines an active or front side while the back surface defines an inactive or back side of the MRAM die. A magnetic shield layer is disposed on the front side of the MRAM die and a magnetic shield structure encapsulates and surrounds the back side and lateral surfaces of the MRAM die. The MRAM package includes a redistribution layer (RDL) disposed over and lines the front side of the MRAM die. The MRAM package also includes an encapsulation layer which covers the MRAM die that is provided with the magnetic shield structure.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following drawings, in which:

FIG. 1a shows an embodiment of a MRAM fan-out wafer level package with package level and chip level magnetic shield protections while

FIGS. 3a-3j show an exemplary embodiment of a process flow for forming a MRAM package with magnetic shield protections using fan-out wafer level packaging.

DETAILED DESCRIPTION

Embodiments of the present disclosure generally relate to MRAM fan-out wafer level packages having package level and chip level magnetic shield protections and methods for forming MRAM packages having package level and chip level magnetic shield protections processed at the wafer-level. The MRAM fan-out wafer level package includes a MRAM chip or die. The MRAM chip or die, for example, may be spin transfer torque magnetic random access memory (STT-MRAM) chip. The MRAM chip includes MRAM cell having a MTJ element. Other suitable types of memory chips may also be useful. The MRAM package as will be described later in this disclosure includes a magnetic shield layer disposed on the front side of the chip and a magnetic shield structure that surrounds the back side and lateral sides of the chip such that the MRAM chip is protected against external magnetic interferences to prevent disturbance or change of spins in the magnetic storage element of the MRAM chip. In some embodiments, the MRAM package may also include a magnetic shield capping layer which covers the MRAM chip provided with magnetic shield layer and structure. Such MRAM packages may be incorporated into electronic products or equipment, such as phones, computers as well as mobile and mobile smart products. Incorporating the packages into other types of products may also be useful.

Figure 1A:
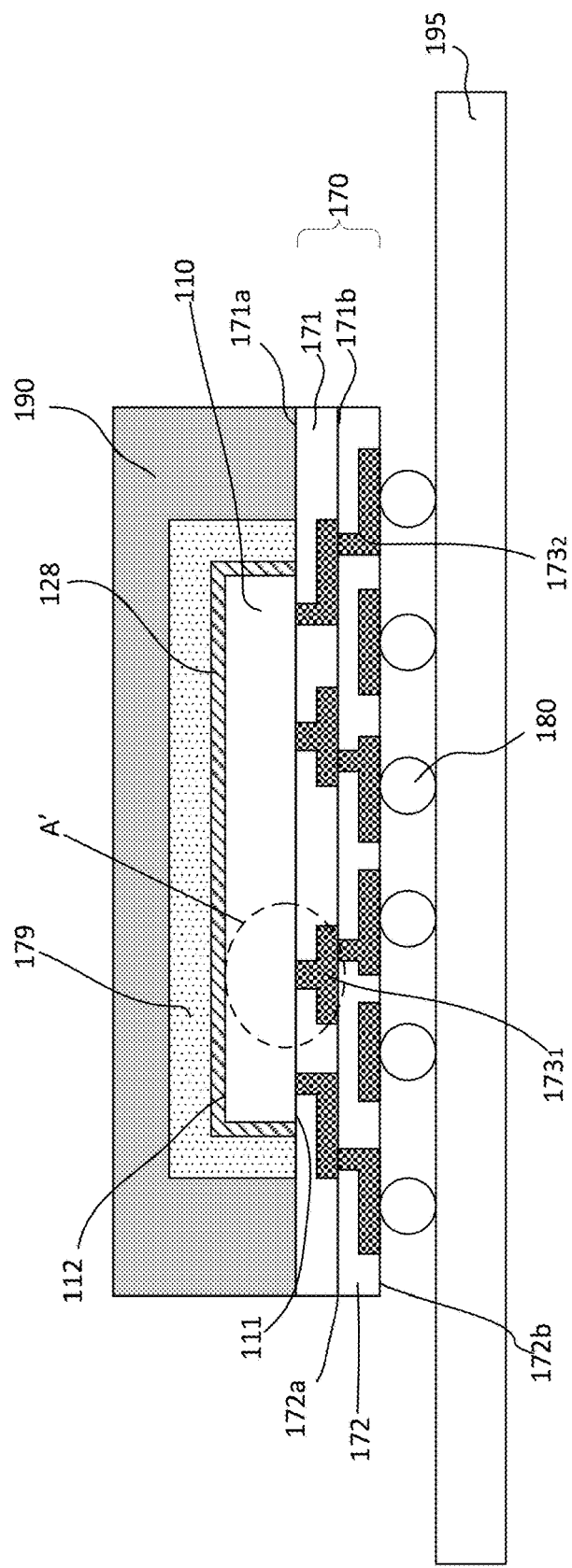

FIG. 1a shows an embodiment of a MRAM fan-out wafer level package or assembly 100. The MRAM fan-out wafer level package 100, as shown, includes a MRAM die or chip 110. The MRAM die or chip, for example, is a singulated die of a MRAM wafer processed with a plurality of dies in parallel. The die has first and second surfaces. One of the surfaces may be an active surface 111 having one or more active components defined thereon while the other surface may be an inactive surface 112. The die, for example, is a MRAM die which includes a magnetic memory component therein.

Figure 1B:
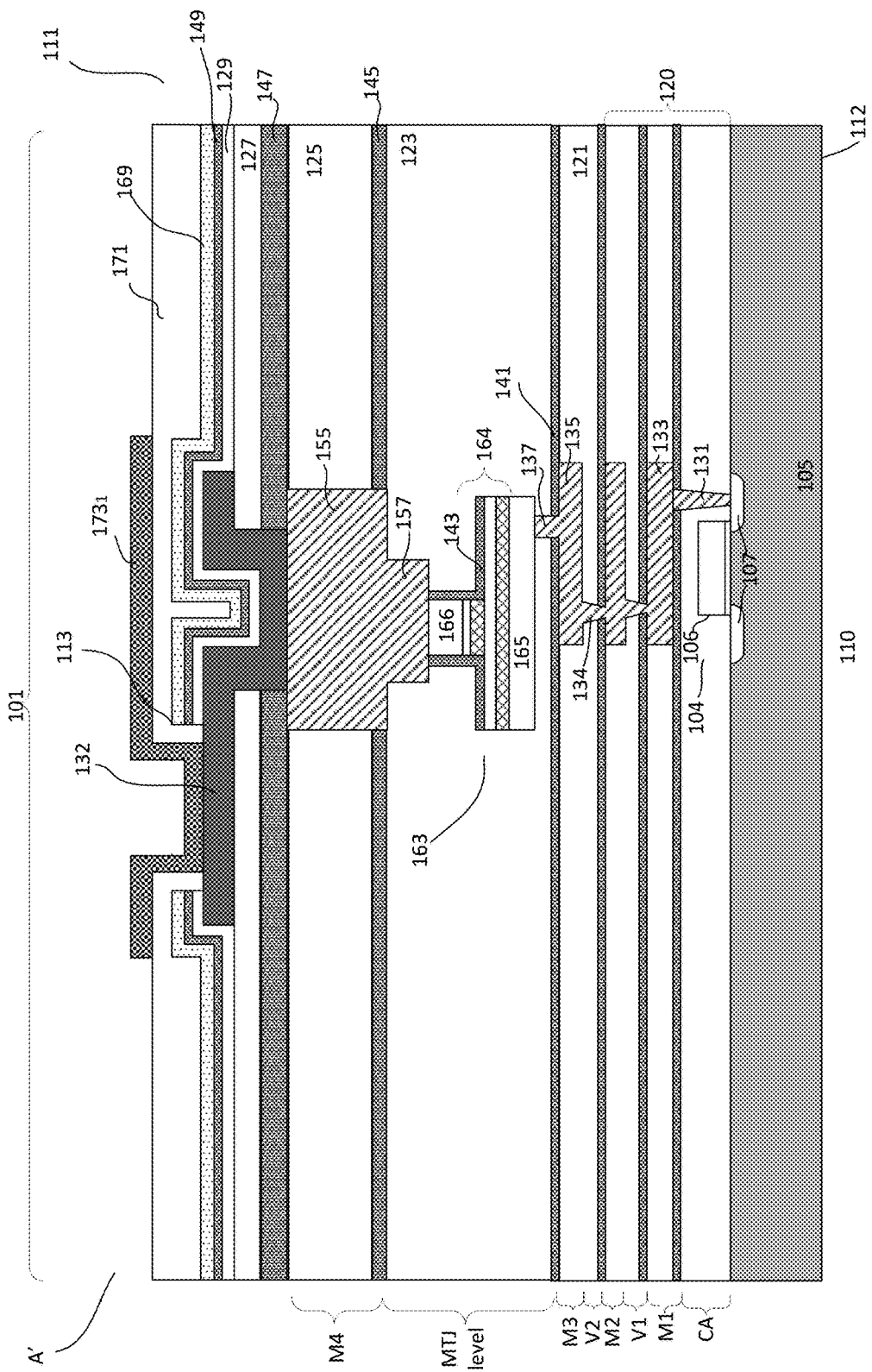
FIG. 1b shows an enlarged view of a portion of the MRAM fan-out wafer level package having a MRAM chip with front side magnetic shield protection.

FIG. 1b shows an enlarged cross-sectional view of a portion A' of the singulated or individual MRAM chip 110 of the MRAM fan-out wafer level package 100 of FIG. 1a. The MRAM chip, for example, includes a MRAM cell such as a non-volatile memory (NVM) cell. The MRAM cell, in one embodiment, is a STT-MRAM cell having MTJ bit element. Other suitable types of memory cell may also be useful.

The cross-sectional view, for example, is taken along a MRAM region 101 of the MRAM die 110. The MRAM cell, for example, is disposed in the MRAM region 101 of a substrate 105. The MRAM region, for example, may be an array region. For example, the array region may include a plurality of MRAM cell regions. For simplicity and illustration purpose, only one MTJ bit from an array of bits is shown. The substrate 105 may include other types of device regions (not shown in this cross-sectional view), such as logic, high voltage (HV), low voltage (LV) and intermediate voltage (IV) device regions. Other types of regions may also be provided.

As described, the MRAM cell is disposed on the substrate 105. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon dioxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material. The substrate may be a part of a MRAM wafer which is processed in parallel to form a plurality of MRAM dies.

The substrate includes a first (front side) surface and a second (back side) surface 112. Front end of line (FEOL) processing is performed on the first surface of the substrate. The FEOL process, for example, forms n-type and p-type transistors in the MRAM region as well as other regions on the substrate. The p-type and n-type transistors, for example, may include complementary MOS (CMOS) transistors and cell selector units. The FEOL processing, for example, includes forming isolation regions, various device and isolation wells, transistor gates and transistor source/drain (S/D) regions and contact or diffusion regions serving as substrate or well taps. Forming other components with the FEOL process may also be useful. For simplicity, only one transistor 104 and its gate 106 and S/D regions 107 are shown.

After the FEOL processing, back end of line (BEOL) processing is performed. The BEOL processing includes forming interconnects in interlevel dielectric (ILD) layers over the first surface of the substrate. The interconnects connect the various components of the integrated circuit (IC) to perform the desired functions. An ILD level includes a metal level and a via level. Generally, the metal level includes conductors or metal lines while the via level includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A die may include a plurality of ILD layers or levels. For example, x number of ILD levels may be provided. As illustrated, the die includes 4 ILD levels (x=4). Other suitable number of ILD levels may also be useful. The number of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components formed in the FEOL process. The dielectric layer may be, for example, silicon dioxide formed by chemical vapor deposition (CVD). The dielectric layer serves as a premetal dielectric layer or first contact layer of the BEOL process. The dielectric layer may be referred to as CA level of the BEOL process. Contacts 131 are formed in the CA level dielectric layer by using mask and etch techniques. A conductive layer, such as tungsten, may be deposited on the substrate by sputtering.

Conductive lines 133 are formed in the M1 level dielectric layer over the CA level. The conductive lines may be formed by a damascene technique using, for example, mask and etch techniques. The conductive material such as copper or copper alloy may be formed by, for example, plating, such as electro or electroless plating. The first metal level M1 and CA may be referred as a lower ILD level.

The process continues to form additional ILD layers or upper ILD layers/levels. The additional ILD levels may include ILD level 2 to ILD level x. For example, in the case where x=4 (4 levels), the additional levels include ILD levels from 2 to 4, which includes metal levels M2 to M4 and via levels V1 to V3. The number of ILD layers may depend on, for example, design requirements or the logic process involved. The ILD layers may be formed of silicon dioxide. Other types of dielectric materials, such as low k, or a combination of dielectric materials may also be useful. The ILD layers may be formed by, for example, CVD. Other techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, PVD and plating techniques. Excess conductive material is removed by, for example, CMP, forming conductors and contacts in an ILD layer.

For simplicity and for illustration purpose, the ILD layers from CA level to M2 level may be collectively referred to as lower ILD layers 120 and dielectric liners, such as NBLoK, may be disposed in between adjacent ILD layers. As shown, a dielectric layer 121 is disposed over the lower ILD layers 120. For illustration purpose, the dielectric layer 121 may be referred to as a first upper dielectric layer and corresponds to ILD level 3. The ILD level 3, for example, includes a via level and a metal level. The ILD level 3, for example, includes via level V2 and metal level M3. One or more via contacts 134 may be disposed in V2 while one or more metal lines 135 may be disposed in M3. The metal line 135, for example, includes a conductive material, such as Cu.

A dielectric liner 141 is disposed over the first upper dielectric layer 121 covering the metal line 135. The dielectric liner, for example, serves as an etch stop layer. The dielectric liner may be a low k dielectric liner. For example, the dielectric liner may be NBLoK. Other suitable types of dielectric materials for the dielectric liner may also be useful.

A second upper dielectric layer 123 is disposed on the first upper dielectric layer 121 with the dielectric liner 141 in between. The second upper dielectric layer, in one embodiment, is Tetraethyl orthosilicate (TEOS). Any suitable dielectric materials and thicknesses for the second upper dielectric layer may be useful. The second upper dielectric layer, for example, may be a dielectric stack having one or more dielectric layers. A via plug 137, for example, may be disposed in the second upper dielectric layer 123 extending through the dielectric liner 141 and is coupled to the metal line 135. The via plug, for example, includes a conductive material, such as Cu. Other suitable types of conductive material may also be useful.

As shown in FIG. 1b, the MRAM region of the MRAM die accommodates a magnetic storage element 163 to form a MTJ bit cell, such as a STT-MRAM cell. In one example, the magnetic storage element is disposed in ILD level 4. ILD level 4, for example, includes a MTJ level and metal level M4. The magnetic storage element, as shown, is disposed in a dielectric layer between adjacent metal levels of upper ILD level. For illustration purpose, the magnetic storage element, is disposed in a dielectric layer 123 which corresponds to the MTJ level in between metal levels M3 and M4. It is understood that the magnetic storage element may be disposed in between any suitable adjacent metal levels.

The magnetic storage element, in one embodiment, includes a MTJ bit element having a MTJ stack 164. The MTJ stack may be disposed between first and second electrodes. The first electrode 165, for example, may be a bottom electrode while the second electrode 166 may be a top electrode. The bottom electrode 165, for example, is connected to the metal line 135 through the via plug 137. For illustration purpose, the MTJ stack, for example, includes four layers. It is understood that the MTJ stack may include any suitable number of layers. For example, the MTJ stack generally includes a magnetically fixed (pinned) layer, one or more tunneling barrier layers and a magnetically free layer. The MTJ stack, for example, may include a bottom-pinned MTJ stack or a top-pinned MTJ stack. Top and bottom refer to position of layers relative to the substrate surface. The magnetic layers of the MTJ stack, for example, may have magnetic orientations in perpendicular/in-plane direction. The MTJ stack, as illustrated, is a simplified MTJ stack. An actual MTJ stack may include other suitable layers.

By way of example, the free layer and the fixed layer may be CoFeB or CoFe based composite material and the tunneling barrier layer may be MgO or $Al_2O_3$. As for the top and bottom electrodes, they may be Ti, TiN, TaN or Ta. Other suitable materials for the MTJ element may also be useful. The various layers of the MTJ stack and the top and bottom electrodes may be formed using suitable deposition techniques, including physical vapor deposition (PVD) and may be patterned using suitable mask and etch technique to achieve a desired configuration.

The top electrode and upper layers of the MTJ stack of the magnetic storage element, for example, include a length dimension which is smaller than a length dimension of the bottom electrode and lower layers of the MTJ stack. A protective liner 143 may optionally be provided to protect portions of the MTJ stack. The protective liner, for example, may include SiN or other suitable dielectric materials. A via contact 157, for example, may optionally be disposed over the top electrode in the second upper dielectric layer 123. Other suitable configurations of the MTJ stack may also be useful.

A dielectric layer 125 is disposed over the second upper dielectric layer 123, covering the magnetic storage element. The dielectric layer 125 and the second upper dielectric layer 123, in one embodiment, correspond to upper ILD level 4. The dielectric layer 125 includes TEOS and may be formed by CVD. Other suitable configurations, materials and forming techniques for the dielectric layer may also be useful.

The dielectric layer 125 for example, includes a metal line 155. The metal line 155, for example, is disposed in metal level M4 and is coupled to the via contact 157. A dielectric liner 145, for example, is disposed between the metal level M4 and the MTJ level. The dielectric liner 145 may include the same or suitable dielectric material as described for dielectric liner 141. The metal line 155, for example, may serve as a bitline (BL). Providing the bitline at other metal levels may also be useful. Although one metal line 155 is shown, it is understood that there could be other suitable number of metal lines in the same metal level.

The via contact 157, for example, may be referred to as the top via contact and the metal line 155, for example, may be referred to as the top metal line. The dimensions of this metal line 155 and its underlying via contact 157, for example, may be defined at twice the minimum line resolution of the lithography and etch capability for a technology process node, which may be referred to as 2× design rule. For example, the thickness of the top metal line 155, for example, may be at least 2 times greater than the thickness of the metal line 135 below. The top via contact and top metal line include a conductive material, such as Cu. Other suitable configurations and conductive materials for the via contact and metal line may also be useful.

A pad level is disposed over the uppermost ILD level and may be referred to as a first surface (or front side) 111 of the MRAM chip or die 110. The pad level, for example, is disposed over Mx. In the case where the device includes 4 metal levels as illustrated in FIG. 1b, the pad level is disposed over M4. The pad level includes a pad dielectric stack. The pad dielectric stack, for example, includes a first pad dielectric layer 147 disposed over the dielectric layer 125 and a second pad dielectric layer 127 disposed over the first pad dielectric layer. For example, the first pad dielectric layer includes silicon nitride while the second pad dielectric layer includes TEOS. The first and second pad dielectric layers may be formed by CVD. Other suitable dielectric materials and forming techniques may also be useful. As shown, a pad interconnect having a pad via contact and a die bump/bond pad 132 is disposed in the pad level. The pad via contact is disposed in a pad opening that extends from the top surface of the second pad dielectric layer to the bottom surface of the first pad dielectric layer while the die bump/bond pad 132 is disposed over the top surface of the second pad dielectric layer. The pad interconnect is coupled to the metal line 155 in the uppermost ILD level (e.g., M4). The pad interconnect, for example, includes an aluminum pad interconnect and may be formed by sputtering. Other suitable conductive materials and forming techniques may also be useful.

A passivation layer may be disposed over the pad dielectric layer. The passivation layer, in one embodiment, includes a passivation stack having first and second passivation layers. For example, the first passivation layer 129 is disposed over the pad dielectric layers and includes a passivation oxide layer while the second passivation layer 149 is disposed over the first passivation layer and includes a passivation nitride layer. Other suitable passivation materials may also be useful.

In one embodiment, a magnetic shield layer 169 is disposed over the passivation layers on the first surface (or front side) 111 of the MRAM chip or die 110. The passivation layers and magnetic shield layer may serve as protective layers. The magnetic shield layer includes a magnetic shield material that does not function by excluding a magnetic field from itself, but rather by collecting and concentrating the magnetic field lines into itself and thereby diverting the field from the magnetically sensitive components to be protected. For example, the magnetic shield layer includes NiFe (Mµ metal) layer. Other suitable types of magnetic shield layer may also be useful. The MRAM chip or die 110, as shown, is provided with front side magnetic shield. As shown, the magnetic shield layer 169 provides chip level magnetic shield protection which protects the MTJ bit element from external magnetic field on the first surface (front side) of the MRAM chip or die.

One or more die bump/bond pad openings 113 are defined through a portion of the front side magnetic shield layer and the passivation layers and exposes a portion of the underlying die bump/bond pad 132. In one embodiment, the opening 113 which exposes the die bump/bond pad provides electrical connection to an external device. For example, the die bump/bond pad opening with the exposed portion of the die bump/bond pad is configured to allow the chip or die to be electrically coupled to an external device as will be described in the following paragraphs.

Referring back to FIG. 1a, a redistribution layer (RDL) 170 is disposed over the front side 111 of the die. The RDL may serve as a medium for coupling the MRAM die to the external device, such as a printed circuit board 195. The RDL, as shown, includes a dielectric stack. The dielectric stack, for example, includes a first dielectric layer 171 and a second dielectric layer 172. The first and second dielectric layers, for example, include polyimide. Other suitable types of dielectric material may also be used for the first and second dielectric layers of the RDL. The first dielectric layer 171 includes first and second major surfaces 171a and 171b while the second dielectric layer includes first and second major surfaces 172a and 172b.

As shown, the first major surface 171a of the first dielectric layer corresponds to the first major surface of the RDL while the second major surface of the second dielectric layer 172b corresponds to the second major surface of the RDL. The first major surface of the RDL is coupled to the front side of the MRAM die. The first dielectric layer of the RDL, for example, directly lines top surface of the magnetic shield layer 169 and exposed side surfaces of the magnetic shield layer and passivation stack at the die bump/pad opening as shown in FIG. 1b. As for the second dielectric layer of the RDL, it is disposed over the first dielectric layer and is away from the front side of the MRAM die.

The RDL includes conductive interconnects $173_1$ and $173_2$ disposed therein. The conductive interconnects, for example, include conductive vias and conductive traces. The conductive vias and traces may be formed of a conductive material, including copper (Cu) or Cu alloy. Other suitable conductive materials are also useful. The conductive interconnects $173_1$ provided in the first dielectric layer of the RDL are coupled to the die bump/bond pads 132 of the MRAM die. As shown in FIG. 1b, the conductive via of the conductive interconnect provided in the first dielectric layer is disposed in the die bump/bond pad opening while the conductive trace is disposed over the second surface 171b of the first dielectric layer. The conductive interconnects $173_1$ of the first dielectric layer couple the die bump/bond pads to conductive interconnects $173_2$ of the second dielectric layer. As shown in FIG. 1b, the first dielectric layer 171 isolates the magnetic shield layer from the interconnect $173_1$ of the RDL.

Continuing with FIG. 1a, package contacts or package balls 180 may be disposed on the second major surface of the RDL as external package contacts. The package contacts 180 may be in the form of, for example, spherical shaped structures, balls or bumps. The package contacts may be formed of a conductive material. For example, the package contacts may be formed of solders, such as lead-based or non lead-based solders. Other suitable conductive materials may also be used. The package contacts may be arranged in any suitable manner, including a regular ball grid array pattern. Arranging the package contacts in other patterns such as a non-regular pattern or providing other types of package contacts are also useful. As shown, the conductive interconnects of the RDL provide electrical connections between the die bump/bond pads of the MRAM die and package balls on the second major surface of the RDL. As shown, the RDL allows the die bump/bond pad positions to be "fanned-out" or extended beyond the original chip area to a larger footprint.

In one embodiment, exposed lateral sides and back side of the MRAM chip is encapsulated with a magnetic shield structure 179 as shown in FIG. 1a. The magnetic shield structure, in one embodiment, is a pre-formed magnetic shield structure which is suitably sized and shaped taken into consideration the size and shape of the MRAM chip. In one embodiment, the magnetic shield structure is in the form of a cylindrical magnetic shield structure. Other suitable shapes for the magnetic shield structure may also be useful. The magnetic shield structure is separated from the inactive (or back side) and lateral surfaces of the MRAM die by a dielectric layer 128 which includes an adhesive or glue. Other suitable dielectric material which provides adhesion and isolates the magnetic shield structure from the die may also be useful. The magnetic shield structure, in one embodiment, includes a thickness of about 100-300 μm. Other suitable thicknesses may also be useful. The magnetic shield structure, in one embodiment, includes a magnetic shield material. The magnetic shield material, for example, includes NiFe (Mμ metal) or electrical steel. Other suitable magnetic shield material which does not function by excluding a magnetic field from itself, but rather by collecting and concentrating the magnetic field lines into itself and thereby diverting the field from the magnetically sensitive components to be protected may also be used as the magnetic shield structure. The magnetic shield structure which surrounds the lateral surfaces and backside or inactive surface of the die protects the sensitive components, such as the MTJ storage element of the MRAM chip, from interferences of external magnetic fields.

Referring to FIG. 1a, the MRAM fan-out wafer level package 100 is provided with an encapsulation or capping layer. The encapsulation or capping layer may include any suitable dielectric material 190, such as but not limited to a mold compound having epoxy based material. The encapsulation layer, in one embodiment, includes sufficient thickness and serves to protect the die 110 during, for example, package singulation, assembly or electrically coupling to the external device, such as the printed circuit board. As shown, the encapsulation layer 190 covers the magnetic shield structure 179 and exposed portions of the first major surface of the RDL 170.

Figure 2:
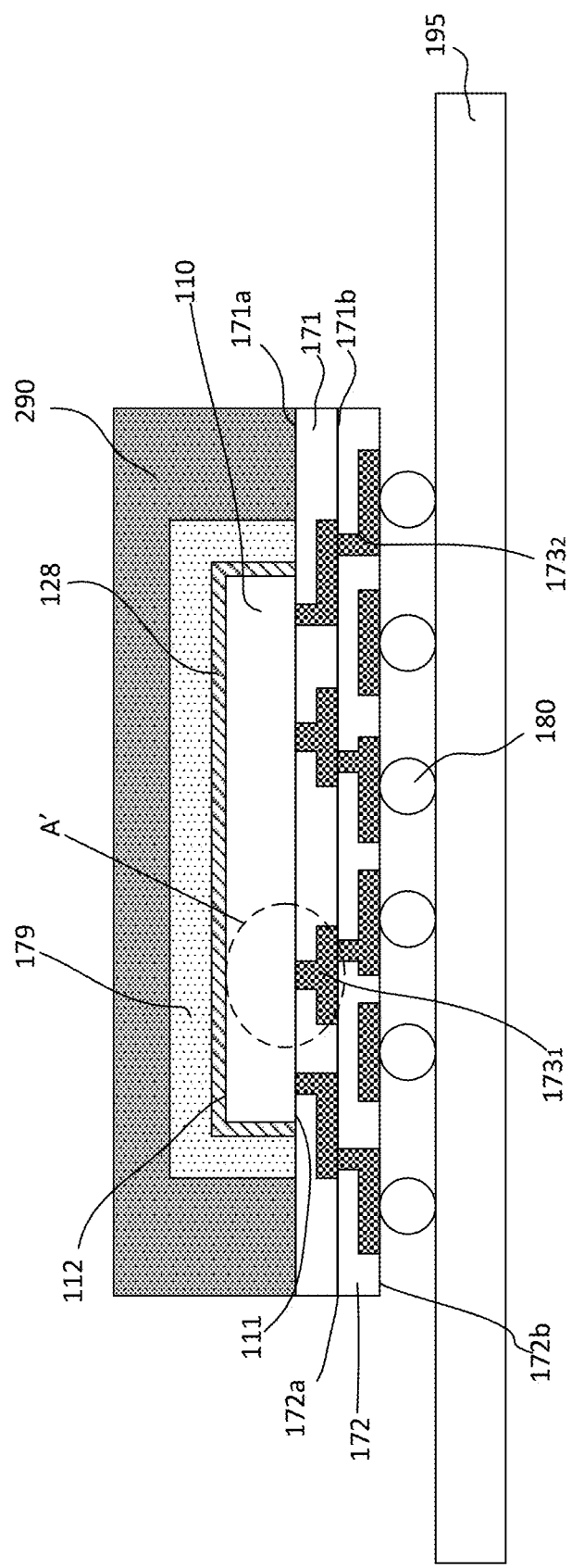
FIG. 2 shows another embodiment of a MRAM fan-out wafer level package with package level and chip level magnetic shield protections.

FIG. 2 shows a cross-sectional view of another embodiment of a MRAM fan-out wafer level package 200. The MRAM fan-out wafer level package 200 as shown in FIG. 2 is similar to the MRAM fan-out wafer level package 100 as shown in FIG. 1a. For example, similar to the MRAM fan-out wafer level package 100 in FIG. 1a, the MRAM fan-out wafer level package 200 also includes a front side magnetic shield layer 169 disposed on the first surface (or front side) of the MRAM die or chip and a magnetic shield structure 179 which surrounds the lateral sides and back side of MRAM die or chip. Common elements or features having the same reference numerals may not be described or described in detail. In the interest of brevity, the description of the MRAM fan-out wafer level package 200 below primarily focuses on the difference(s) compared with the MRAM fan-out wafer level package 100 shown in FIG. 1a.

Referring to FIG. 2, the MRAM fan-out wafer level package 200 is provided with an encapsulation or capping layer. The encapsulation or capping layer, in one embodiment, includes a highly permeable mold compound having a magnetic permeable dielectric material 290. The permeability of magnetic material varies with the type of alloy and combination. Different materials have different saturation levels. For example, an iron/nickel compound typically has twice the constant relative permeability as mere iron. The permeability also varies with particle size generally diminishing with increasing particle size. For example, barium-ferrite nanoparticles $Ba(CoTi)_X Fe_{12-2X}O_{19}$ or a silicon carbide filler such as ECCOSORB® DSF has higher purity crystalline and smaller particle size which gives higher permeability property and may be used as the magnetic permeable dielectric material 290. Other suitable types of magnetic permeable dielectric materials may also be useful.

The embodiments as described in FIGS. 1a-1b and 2 provide for package level and chip level magnetic shielding processed at the wafer-level. The MRAM fan-out wafer level package as described may be electrically connected to an external device, such as a printed circuit board. The MRAM assembly or package may further include one or more magnetic shield structures disposed substantially surrounding or adjacent to the MTJ element within the chip. A description of various magnetic shield structures which are disposed substantially surrounding or adjacent to the MTJ element is provided in, for example, co-pending U.S. patent application Ser. No. 15/162,594, filed on May 23, 2016, entitled "Magnetic Shielding for MTJ Device or Bit", which is herein incorporated by reference for all purposes. The magnetic shield structures that are disposed substantially surrounding or adjacent to the MTJ element within the chip further enhance the shielding capability especially from magnetic fields generated by local die level interconnects.

FIGS. 3a-3j illustrate an embodiment of a process 300 for forming a MRAM fan-out wafer level package. The MRAM fan-out wafer level package formed by process 300 is similar or the same as the MRAM fan-out wafer level package as described in FIG. 1a or 2. Common elements, indicated by the same reference numerals, may not be described or described in detail. For simplicity, the processes of forming transistors on the substrate 105 using FEOL processing and forming the ILD levels with various via contacts and metal lines as well as forming the magnetic storage element having MTJ stack in adjacent metal levels in the ILD layer using back end of line (BEOL) processing will not be described.

Figure 3A:
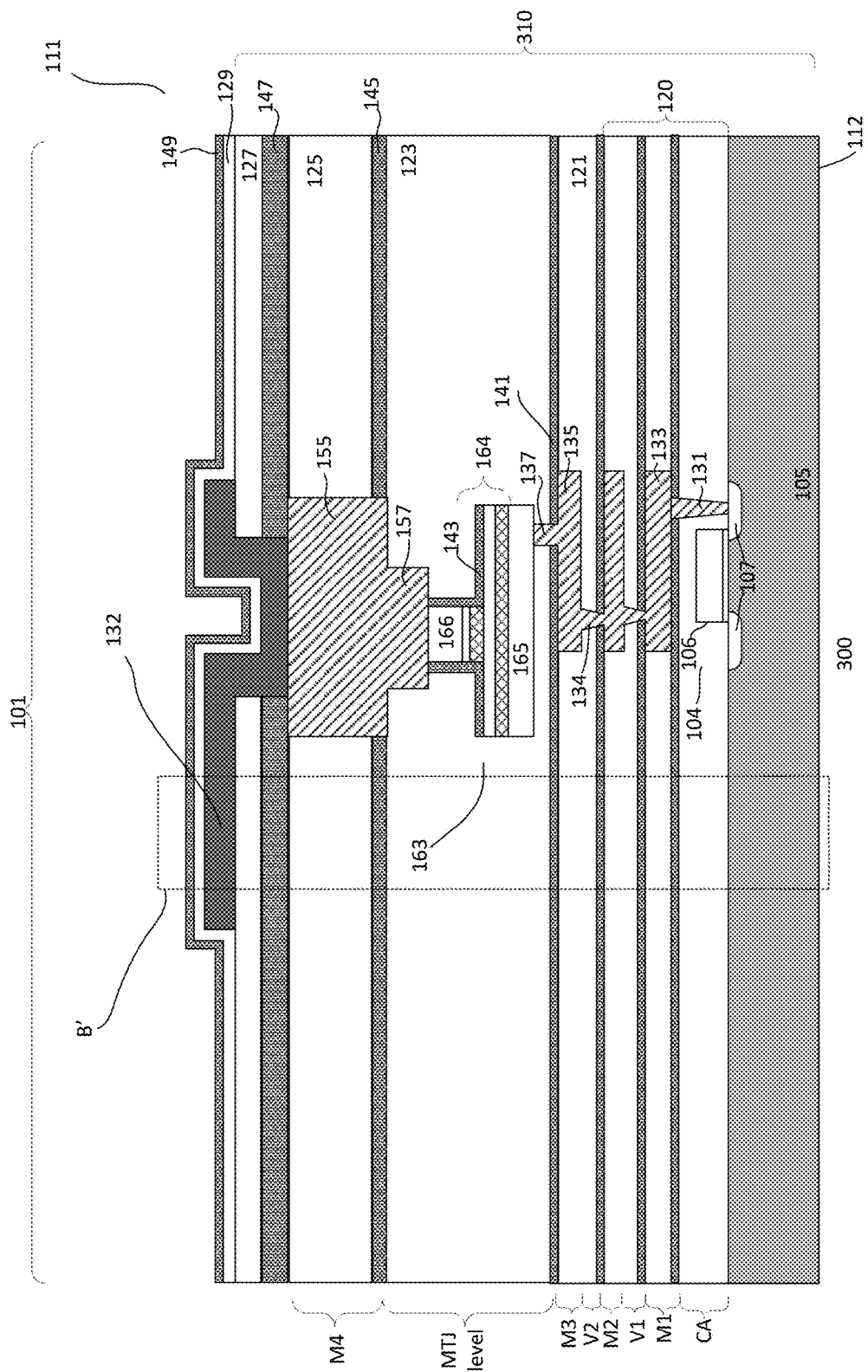

Referring to FIG. 3a, a portion of a processed MRAM wafer is shown. As shown, the magnetic storage element is defined within the MRAM region 101 while scribe/saw lane regions surrounding the MRAM region and other device regions are not shown. The process 300 is at the stage of wafer level processing immediately after forming a pad level having a first pad dielectric layer 147 and a second pad dielectric layer 127 covering the metal line 155 in the uppermost upper ILD layer (e.g., M4). For example, the first pad dielectric layer includes silicon nitride having a thickness of about 3000 Å while the second pad dielectric layer includes TEOS having a thickness of about 4500 Å. Other suitable dielectric materials and thicknesses may also be useful.

Referring to FIG. 3a, the process 300 continues to form one or more die bump/bond pads 132. As shown, a pad via opening is formed in the first and second pad dielectric layers. The pad opening, for example, extends from the top surface of the second pad dielectric layer to the bottom surface of the first pad dielectric layer and exposes a portion of the metal line 155. The pad via opening may be formed by mask and etch techniques. For example, a patterned photoresist mask (not shown) may be formed over the pad level, serving as an etch mask. An etch, such as RIE, may be used to pattern the pad dielectric layers with the patterned mask. The etch, for example, removes the exposed portions of the first and second pad dielectric layers to expose a portion of the metal line 155.

A conductive layer is formed on the substrate, covering the pad level and fills the pad via opening. The conductive layer, for example, is an aluminum layer. The aluminum layer, for example, is used to form an aluminum pad interconnect. The conductive layer may be formed by, for example, sputtering. Other suitable conductive materials and forming techniques may also be useful. The conductive layer is patterned using suitable mask and etch technique to define a pad interconnect having a pad via contact lining the pad via opening and a die bump/bond pad 132 disposed over the top surface of the second pad dielectric layer 127.

In FIG. 3*a*, the process 300 continues to form a passivation layer on the first surface (or front side) 111 of the wafer. In one embodiment, the process forms a first passivation layer 129 over the top surface of the second pad dielectric layer while a second passivation layer 149 is formed over the first passivation layer. For example, the first passivation layer includes a passivation oxide layer having a thickness of about 5000 Å while the second passivation layer includes a passivation nitride layer having a thickness of about 4800 Å. The first and second passivation layers may be formed by CVD. Other suitable passivation materials, thicknesses and forming techniques may also be useful.

Figure 3D:
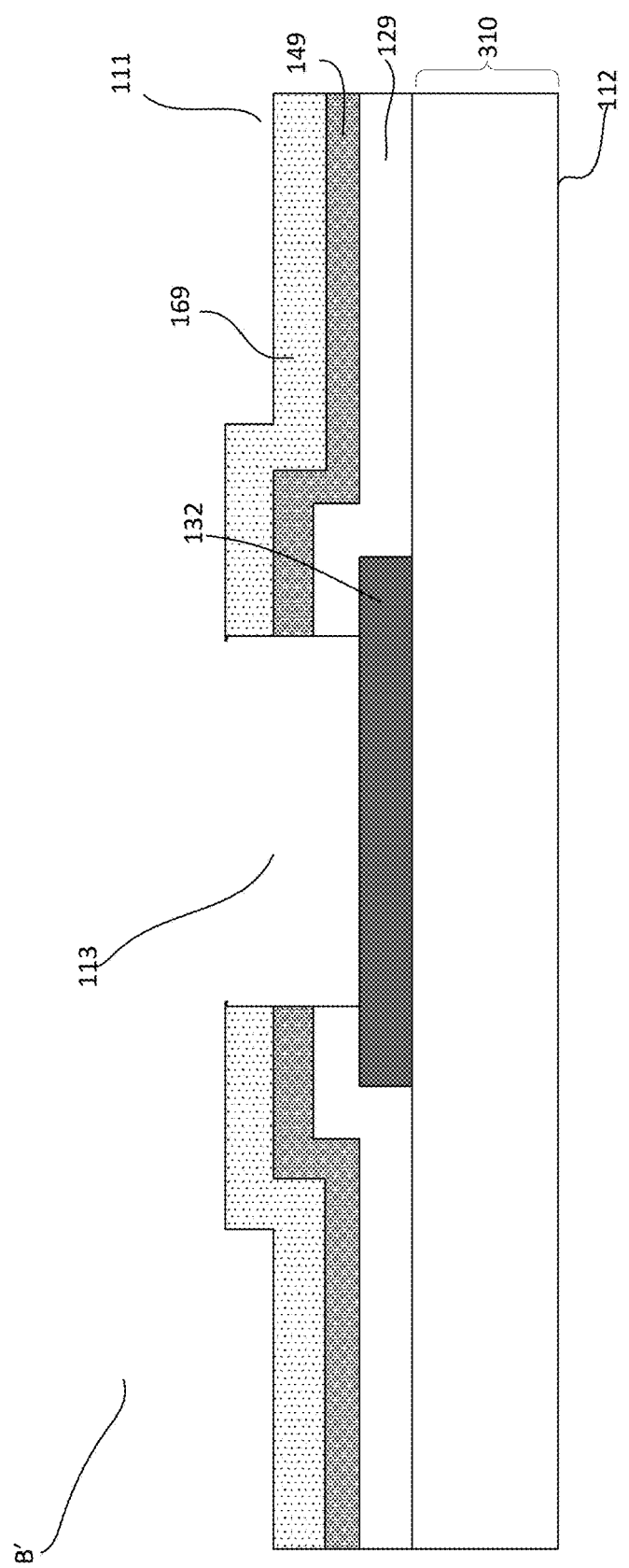

FIGS. 3*b*-3*d* show subsequent processing steps of process 300. For simplicity, an enlarged view of a portion B' of the MRAM wafer is illustrated in FIGS. 3*b*-3*d*. For simplicity and illustration purpose, the substrate 105 and the features or components formed by FEOL and BEOL processing are collectively shown as structure 310 in FIGS. 3*b*-3*d*.

Referring to FIG. 3*b*, the MRAM wafer is processed at the stage where first and second passivation layers 129 and 149 are formed on the first surface (or front side) 111 of the MRAM wafer as described in FIG. 3*a*. The process 300 continues by providing a magnetic shield layer 169. In one embodiment, the magnetic shield layer 169 is conformally formed over the passivation layers on the front side 111 of the MRAM wafer as shown in FIG. 3*c*. The magnetic shield layer, for example, includes a magnetic shield material that does not function by excluding a magnetic field from itself, but rather by collecting and concentrating the magnetic field lines into itself and thereby diverting the field from the magnetically sensitive components to be protected. For example, the magnetic shield layer includes NiFe (Mµ metal) layer. The magnetic shield layer may be formed by PVD or electrochemical deposition (plating) or a combination thereof having a thickness of about 5 nm-1 µm. Other suitable magnetic shield layer, forming techniques and thicknesses may also be useful.

One or more die bond pad openings 113 are formed through the magnetic shield layer and the passivation layers, exposing a portion of the die bump/bond pad 132 in the pad level as shown in FIG. 3*d*. To form the die bump/bond pad openings, the magnetic shield and passivation layers may be patterned using suitable mask and etch techniques. Exposed portions of the magnetic shield and passivation layers are removed by RIE. Other suitable techniques may also be useful. The die bump/bond pad opening 113 exposes underlying die bump/bond pad 132 which allows for electrical connection through a RDL layer to exterior device as will be described later.

In one embodiment, the process 300 continues with a singulation process (not shown) which is performed through the scribe/saw lane regions (not shown). In one embodiment, the singulation process may be achieved by mechanical sawing, DRIE or other suitable techniques. In one embodiment, the singulation process singulates or separates the MRAM dies or chips in a wafer format through the scribe/saw lane regions to form individual MRAM chips or dies 110, such as that described and shown in FIG. 1*a*. The MRAM chips or dies include the magnetic shield and passivation layers lining the front side 111 of the dies or chips. The sensitive MTJ array of the MRAM chip is protected on the first surface (or front side) from magnetic field interferences. The magnetic shield layer covering the first surface (active surface) of the die or chip protects the sensitive MTJ array from top interferences of external magnetic fields. Thus, the MRAM chip is provided with front side magnetic shield at this stage.

In one embodiment, the process continues by providing a support carrier 395 having top and bottom surfaces 395*a*-395*b*. The support carrier, for example, is a temporary carrier for processing the MRAM dies. The support carrier should be sufficiently rigid to serve as a temporary support and withstand further processing steps. By way of non-limiting example, the support carrier may be a mold frame. Various types of materials may be used to serve as the support carrier.

An adhesive layer 398 is provided on the first or top surface 395*a* of the support carrier. Other temporary bonding techniques may also be useful. The adhesive, for example, can be any type of adhesive that provides temporary bonding of the dies to the support carrier. The adhesive may include any suitable material and may be in different form and may be provided on the support carrier using various techniques. The technique employed may depend on the type or form of the adhesive.

Referring to FIG. 3*e*, the singulated or individual MRAM dies 110 are attached to the support carrier 395 via the adhesive. The MRAM dies are placed on the support carrier via pick and place technique. For simplicity and illustration purpose, two MRAM dies 110$_1$ and 110$_2$ are shown. It is understood that other suitable number of MRAM dies may be placed on the support carrier. In one embodiment, the MRAM dies are placed on top of the support carrier and the dies are separated from each other by a predetermined distance. The predetermined distance, for example, should be sufficiently wide to accommodate a magnetic shield structure and encapsulant material and tools used for a further singulation as will be described in detail later. The individual MRAM dies arranged with predetermined distance between each other are now processed together, for example in a wafer format, on the support carrier. In one embodiment, the MRAM dies are placed such that the front side (111) of the dies are facing the top surface 395*a* of the support carrier.

In one embodiment, the process 300 continues by providing a magnetic shield structure 179 over the MRAM die. By way of an example, the magnetic shield structure is a pre-formed magnetic shield structure and is attached to the MRAM die through a dielectric layer 128. In such case, a dielectric layer 128 is provided on the back side (or inactive surface) 112 and lateral surfaces of the MRAM dies prior to providing the magnetic shield structure as shown in FIG. 3*f*. The dielectric layer 128, for example, includes an adhesive or glue. The adhesive or glue may be provided over the back side and lateral surfaces of the MRAM dies by jet spraying technique. Other suitable dielectric layer which provides adhesion and isolates the magnetic shield structures from the MRAM dies and other suitable techniques for providing the dielectric layer may also be useful.

In one embodiment, the pre-formed magnetic shield structure is suitably sized and shaped taken into consideration the size and shape of the MRAM die. The magnetic shield structure, for example, is in the form of a cylindrical magnetic shield structure. Other suitable shapes for the magnetic shield structure may also be useful. The pre-formed magnetic shield structure is provided over the MRAM die via pick and place technique. As shown, the dielectric layer 128 provides adhesion and isolates the magnetic shield structure from the MRAM die. The magnetic shield structure, in one embodiment, includes a thickness of about 100-300 µm. Other suitable thicknesses may also be useful. The magnetic shield structure, in one embodiment, includes a magnetic shield material. The magnetic shield material, for example, includes NiFe (Mµ metal) or electrical steel. Other suitable magnetic shield material which does not function by excluding a magnetic field from itself, but rather by collecting and concentrating the magnetic field lines into itself and thereby diverting the field from the magnetically sensitive components to be protected may also be used as the magnetic shield structure.

As described, the magnetic shield structure 179 is a pre-formed magnetic shield structure and is provided over the MRAM die through pick and place technique. It is understood that the magnetic shield structure 179 may not be a pre-formed magnetic shield structure and may be provided to encapsulate the back side and lateral surfaces of the MRAM die through any suitable techniques.

The process continues by providing an encapsulation or capping layer 390 over the individual MRAM dies 110 which are encapsulated with magnetic shield structures 179. The encapsulation layer may include any suitable encapsulant material, such as but not limited to a mold compound having epoxy based material. Other suitable types of encapsulant material may also be useful. In one embodiment, an encapsulant material, such as an epoxy based material, is deposited to fill the gaps between the individual MRAM dies with magnetic shield structures as shown in FIG. 3g. The encapsulant material may be provided using wafer level molding technique. Other suitable techniques may also be useful. In such case, the encapsulation layer fills and covers the gaps as well as sidewalls and exposed top surfaces of the magnetic shield structures over the individual MRAM dies as shown in FIG. 3g.

Referring to FIG. 3h, a debonding treatment is performed. The debonding treatment may, for example, cause the adhesive 398 over the support carrier 395 to lose or reduce its adhesive strength to allow separation of the encapsulated MRAM dies with magnetic shield structures in wafer format from the support carrier. The debonding treatment, for example, includes a temperature or heat treatment. Other suitable types of debonding treatments may also be useful, depending on the type of adhesive used. As shown, the removal of the support carrier exposes front side (111) of the encapsulated MRAM dies which are arranged in wafer format for further processing.

In one embodiment, the process 300 continues to form a RDL layer 170 over the front side of the encapsulated MRAM dies which are arranged in wafer format as shown in FIG. 3i. To form the RDL layer, a first dielectric layer 171 may be deposited over exposed surfaces of the encapsulation layer 390, magnetic shield structures 179 and front side (111) of the MRAM dies and fills the die bump/bond pad openings (not shown) of the MRAM dies. The first dielectric layer 171 is patterned to expose the die bump/bond pads of the MRAM dies. A first conductive layer is deposited and etched to define the interconnects $173_1$ in the first dielectric layer and are coupled to the exposed portions of the die bump/bond pads. Thereafter, a second dielectric layer 172 is deposited over the first dielectric layer and is patterned to exposed top surfaces of the interconnects $173_1$ and a second conductive layer is deposited and etched to define the interconnects $173_2$ in the second dielectric layer which are coupled to the interconnects $173_1$ of the first dielectric layer. The first and second dielectric layers, for example, include polyimide and may be formed by coating while the first and second conductive layers include copper or copper alloy and may be formed by a combination of PVD and plating techniques. Other suitable materials and forming techniques may also be employed for forming the RDL. Although two dielectric layers are illustrated, it is understood that the RDL may include any suitable numbers of dielectric layers and interconnects, depending on the desired input/output and wiring requirements.

The process 300 continues by forming package contacts 180 coupled to the exposed portions of the interconnects $173_2$ of the RDL which may serve as package contact pads, as shown in FIG. 3i. For example, the package contacts are formed and coupled to the package contact pads. The package contacts, for example, may include spherical shaped structures or balls arranged in grid pattern and may be formed by bumping technique. The package contacts are formed of a conductive material. The package contacts, for example, can be formed from solder. Various types of solder can be used to form the package contacts. For example, the solder can be a lead-based or non lead-based solder. In some embodiments, other types of package contacts, such as but not limited to solder lands, are coupled to the package pads. The package contacts may be formed of materials other than solder or using other techniques.

Referring to FIG. 3j, a further singulation process is performed through the encapsulated MRAM dies with magnetic shield structures which are arranged in wafer format. The singulation process employs suitable techniques such as those described in FIG. 3d to form individual MRAM fan-out wafer level packages. The encapsulated packages are separated from each other after preforming the singulation process. As shown, the singulated packages are the same as the MRAM fan-out wafer level package 100 as described and as shown in FIG. 1a.

In another embodiment, the process 300 may be modified to form the package 200 as described and as shown in FIG. 2. In such case, the process step as shown in FIG. 3g may be modified to provide a mold compound having a magnetic permeable dielectric material 290 instead of a mold compound having an epoxy based material. For example, barium-ferrite nanoparticles $Ba(CoTi)_X Fe_{12-2X}O_{19}$ or a silicon carbide filler such as ECCOSORB® DSF which has high permeability property may serve as the magnetic permeable dielectric material 290 and may be formed over the MRAM dies provided with magnetic shield structures which are placed on top of the support carrier as shown in FIG. 3g. Other suitable types of magnetic permeable dielectric materials may also be useful.

The embodiments as described in this disclosure result in various advantages. For example, the MRAM fan-out wafer level packages as described have magnetic shield layer disposed on front side of the MRAM chip and a magnetic shield structure surrounding the back side and lateral surfaces of the MRAM chip. This provides package level and chip level magnetic shield protection for the MRAM fan-out wafer level package. Furthermore, the package level and chip level magnetic shield protections are processed at the wafer-level. Thus, the cycle time is lower compared to individual die packaging level magnetic shielding. In addition, the RDL allows the die bump/bond pad positions to be "fanned-out" or extended beyond the original chip area to a larger footprint, enabling increased number of input/output and complex wiring requirements to be achieved. The RDL which directly lines the front side of the MRAM die avoid the use of a separate package substrate, allowing thinner packages to be formed which also improves in form factor.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a magnetic random access memory (MRAM) package, comprising:
   providing a MRAM wafer having first and second major surfaces, wherein the first major surface is the front side and the second major surface is the back side of the MRAM wafer, and wherein the MRAM wafer is prepared with a plurality of MRAM dies; and
   processing the MRAM wafer, wherein processing the MRAM wafer comprises:
      forming a magnetic shield layer over the front side of the MRAM wafer, and
      separating the MRAM wafer into a plurality of individual dies, wherein an individual MRAM die comprises front, back and lateral surfaces, wherein the magnetic shield layer is disposed over the front surface of the individual MRAM die;
      attaching the individual MRAM dies to a support carrier having top and bottom surfaces, wherein the individual MRAM dies are arranged with a predetermined distance between each other, creating a gap between adjacent MRAM dies;
      providing magnetic shield structures over the individual MRAM dies, wherein the magnetic shield structure encapsulates and surrounds back and lateral surfaces of the MRAM die, without covering the gap between adjacent MRAM dies;
      forming an encapsulation layer, wherein the encapsulation layer covers the individual MRAM dies which are provided with magnetic shield structures;
      forming a redistribution layer (RDL) over and lining exposed front surfaces of the encapsulated MRAM dies, wherein the encapsulation layer is in contact with exposed portions of a first major surface of the RDL; and
      separating the encapsulated MRAM dies into individual MRAM fan-out wafer level packages.

2. The method of claim 1 wherein providing the MRAIVI wafer comprises providing a substrate having first and second surfaces and wherein processing the wafer comprises:
   forming an upper inter level dielectric (ILD) layer over the first surface of the substrate, wherein the upper ILD layer comprises a plurality of ILD levels;
   forming a magnetic storage element having a magnetic tunneling junction (MTJ) array with MTJ stack and in between adjacent ILD levels of the upper ILD layer;
   forming a pad level over the magnetic storage element, wherein the pad level comprises a die bump/bond pad coupled to the magnetic storage element and the pad level defines the front side of the MRAM wafer; and
   forming a passivation layer covering the pad level.

3. The method of claim 2 wherein the magnetic shield layer is formed over the passivation layer.

4. The method of claim 3 wherein the magnetic shield layer includes NiFe metal) layer.

5. The method of claim 2 wherein the RDL comprises first and second dielectric layers and interconnects formed in each of the first and second dielectric layers, wherein the interconnect of the first dielectric layer is coupled to the die bump/bond pad.

6. The method of claim 1 comprising:
   providing an adhesive layer over the top surface of the support carrier; and
   attaching the individual MRAM dies to the adhesive layer, wherein the individual MRAM dies are placed such that the front surface of the MRAIVI dies is facing the support carrier and are processed together in a wafer format on the support carrier.

7. A method of forming a magnetic random access memory (MRAM) package, comprising:
   providing a MRAIVI wafer having first and second major surfaces, wherein the first major surface is the front side and the second major surface is the back side of the MRAM wafer and wherein the MRAIVI wafer is prepared with a plurality of MRAIVI dies; and
   processing the MRAM wafer, wherein processing the MRAIVI wafer comprises:
      forming a magnetic shield layer over the front side of the MRAM wafer, and separating the MRAIVI wafer into a plurality of individual dies, wherein an individual MRAM die comprises front, back and lateral surfaces, wherein the magnetic shield layer is disposed over the front surface of the individual MRAIVI die;
      providing a support carrier having top and bottom surfaces;
      providing an adhesive layer over the top surface of the support carrier;
      attaching the individual MRAM dies to the adhesive layer, wherein the individual MRAIVI dies are placed such that the front surface of the MRAIVI dies is facing the support carrier and the individual MRAM dies are arranged with a predetermined distance between each other and are processed together in a wafer format on the support carrier;
      providing magnetic shield structures over the individual MRAM dies, wherein the magnetic shield structure encapsulates and surrounds back and lateral surfaces of the MRAM die, and wherein the magnetic shield structures are provided over the individual MRAIVI dies using pick and place technique;
      forming an encapsulation layer, wherein the encapsulation layer covers the individual MRAIVI dies which are provided with magnetic shield structures;
      forming a redistribution layer (RDL) over and lining exposed front surfaces of the encapsulated MRAM dies, wherein the encapsulation layer is in contact with exposed portions of a first major surface of the RDL; and
      separating the encapsulated MRAIVI dies into individual MRAM fan-out wafer level packages.

8. The method of claim 7 wherein the magnetic shield structures are pre-formed magnetic shield structures.

9. The method of claim 8 wherein the pre-formed magnetic shield structures are in the form of a cylindrical magnetic shield structure.

10. The method of claim 7 comprising providing dielectric layer over the individual MRAM dies which are placed on the support carrier prior to providing the magnetic shield structures.

11. The method of claim 1 wherein the magnetic shield layer and the magnetic shield structures include NiFe (Mµ metal) layer or electrical steel.

12. The method of claim 1 wherein the encapsulation layer comprises an epoxy based material or a magnetic permeable dielectric material.

13. The method of claim 1 comprising providing package contacts over the RDL prior to separating the encapsulated MRAM dies into individual MRAM fan-out wafer level packages.

14. A method of forming a magnetic random access memory (MRAM) package, comprising:
- providing a plurality of MRAM dies, each of the MRAM die having front, back and lateral surfaces, wherein the front surface defines an active or front side while the back surface defines an inactive or back side of the MRAM die;
- forming a magnetic shield layer on the front side of the plurality of MRAM dies;
- attaching the plurality of MRAM dies to a support carrier having top and bottom surfaces, wherein the MRAM dies are arranged with a predetermined distance between each other, creating a gap between adjacent MRAM dies;
- providing a magnetic shield structure which encapsulates and surrounds the back side and lateral surfaces of each of the MRAM die, wherein the magnetic shield structure does not cover the gap between adjacent MRAIVI dies;
- forming a redistribution layer (RDL) over and lining the front side of the plurality of MRAM dies; and
- forming an encapsulation layer over the plurality of MRAIVI dies, wherein the encapsulation layer is in contact with exposed portions of a first major surface of the RDL.

15. The method of claim 14 wherein the magnetic shield structure comprises a pre-formed magnetic shield structure.

16. The method of claim 15 wherein the pre-formed magnetic shield structure is in the form of a cylindrical magnetic shield structure.

* * * * *

UNITED STATES PATENT AND TRADEMARK OFFICE
CERTIFICATE OF CORRECTION

PATENT NO. : 10,475,985 B2
APPLICATION NO. : 15/241100
DATED : November 12, 2019
INVENTOR(S) : Bharat Bhushan et al.

Page 1 of 1

It is certified that error appears in the above-identified patent and that said Letters Patent is hereby corrected as shown below:

In the Claims

Column 15, Claim 2, Line 51, change "MRAIVI" to --MRAM--
Column 16, Claim 6, Line 13, change "MRAIVI" to --MRAM--
Column 16, Claim 7, Lines 18-57, change 11 instances of "MRAIVI" to --MRAM--
Column 18, Claim 14, Lines 7-12, change 2 instances of "MRAIVI" to --MRAM--

Signed and Sealed this
Twenty-fourth Day of December, 2019

Andrei Iancu
*Director of the United States Patent and Trademark Office*